US010450650B2

(12) United States Patent
Sultana et al.

(10) Patent No.: US 10,450,650 B2
(45) Date of Patent: Oct. 22, 2019

(54) METHOD OF MANUFACTURING LARGE AREA GRAPHENE AND GRAPHENE-BASED PHOTONICS DEVICES

(71) Applicant: U.S.A. represented by the Administrator of the National Aeronautics and Space Administration, Washington, DC (US)

(72) Inventors: Mahmooda Sultana, Laurel, MD (US); Mary J. Li, Bethesda, MD (US); Anthony W. Yu, Spencerville, MD (US)

(73) Assignee: The United States of America as represented by the Admininstrator of the National Aeronautics and Space Administration, Washington, DC (US)

( * ) Notice: Subject to any disclaimer, the term of this patent is extended or adjusted under 35 U.S.C. 154(b) by 780 days.

(21) Appl. No.: 14/864,442

(22) Filed: Sep. 24, 2015

(65) Prior Publication Data

US 2017/0088944 A1    Mar. 30, 2017

(51) Int. Cl.
*B32B 9/00* (2006.01)
*C23C 16/26* (2006.01)
(Continued)

(52) U.S. Cl.
CPC ............ *C23C 16/26* (2013.01); *C01B 32/186* (2017.08); *C01B 32/194* (2017.08); *C23C 16/01* (2013.01);
(Continued)

(58) Field of Classification Search
CPC ........ C01B 31/04; Y10T 428/30; B82Y 30/00
(Continued)

(56) References Cited

U.S. PATENT DOCUMENTS

| 2010/0143726 | A1* | 6/2010 | Golzhauser | ............ | B05D 1/283 |
| | | | | | 428/446 |
| 2011/0048625 | A1* | 3/2011 | Caldwell | ................ | B82Y 30/00 |
| | | | | | 156/233 |

(Continued)

OTHER PUBLICATIONS

Kurzweilai, Nasa investigates use of graphene for new sensors, Accelerating Intelligence. News, Dec. 7, 2012, pp. 1-3.
(Continued)

*Primary Examiner* — Daniel H Miller
(74) *Attorney, Agent, or Firm* — Christopher O. Edwards; Bryan A. Geurts (57) ABSTRACT

The present invention relates to a method of manufacturing large area graphene for graphene-based photonics devices such as bolometric graphene detectors, or for use as a saturable absorber in ultra-high bandwidth detectors for producing ultrafast laser pulses. The method includes: growing a first graphene layer on one side of a metal substrate, and a second graphene layer on another side of the metal substrate; coating the first graphene layer with a plurality of resist layers including a low molecular weight polymethylmethacrylate, and a high molecular weight polymethylmethacrylate; removing the second graphene layer and the metal substrate to reveal the first graphene layer; disposing the first graphene layer on an optical substrate; and removing the plurality of resist layers from the first graphene layer to reveal a final graphene layer, which can be used as the basis to manufacture a multilayer graphene structure for graphene detectors.

16 Claims, 8 Drawing Sheets

(51) Int. Cl.
  *C23C 16/01* (2006.01)
  *G02F 1/01* (2006.01)
  *G02B 6/02* (2006.01)
  *G02F 1/35* (2006.01)
  *C01B 32/186* (2017.01)
  *C01B 32/194* (2017.01)
  *G02B 6/36* (2006.01)
  *F21V 8/00* (2006.01)
  *B82Y 20/00* (2011.01)
  *B82Y 40/00* (2011.01)

(52) U.S. Cl.
  CPC .......... *G02B 6/0008* (2013.01); *G02B 6/02* (2013.01); *G02B 6/3624* (2013.01); *G02F 1/011* (2013.01); *G02F 1/3523* (2013.01); *B82Y 20/00* (2013.01); *B82Y 40/00* (2013.01)

(58) Field of Classification Search
  USPC ................ 428/408; 423/447.1, 448; 252/501
  See application file for complete search history.

(56) References Cited

U.S. PATENT DOCUMENTS

2011/0158268 A1* 6/2011 Song ............... H01S 3/1118
  372/18
2012/0040145 A1* 2/2012 Zenasni ............ B81C 1/00126
  428/189

OTHER PUBLICATIONS

Basu S. et al, Recent developments on graphene and graphene oxide based solid state gas sensors, Sensors and Actuators B: Chemical, 2012, 173, pp. 1-21.

Zakaria A. et al, Improved Maturity and Ripeness Classifications of *Magnifera indica* cv. *Harumanis* Mangoes through Sensor Fusion of an Electronic Nose and Acoustic Sensor, Sensors, 2012, pp. 6023-6048.

* cited by examiner

METHOD OF MANUFACTURING LARGE AREA GRAPHENE AND GRAPHENE-BASED PHOTONICS DEVICES

BACKGROUND OF THE INVENTION

1. Field of the Invention

The present invention relates to a method of manufacturing large area graphene, and the resulting graphene-based photonics devices, which are used in a variety of applications.

2. Description of the Related Art

A Laser Imaging and Detection and Ranging (LIDAR) system is a remote sensing technology that provides for the detection, identification, and the precision measurement of the range of a target in military missions, using a laser to illuminate the target and analyze the reflected light. The components of a scanning LIDAR system include a laser, a scanner and optics (i.e., oscillating plane minors, a combination with a polygon mirror, a dual axis scanner etc.), photodetectors and receiver electronics, and position and navigation systems (i.e., Global Positioning System (GPS) and Inertial Measurement Unit (IMU)). Typically, a laser with shorter pulses achieves better target resolution, provided the LIDAR receiver detectors and electronics have sufficient bandwidth. With respect to photodetectors, solid state photodetectors, such as silicon photodiodes are used.

Currently, photon-counting detectors do not really exist for wavelengths beyond 1 μm. LIDAR sensors require high bandwidth and low-noise photodetectors operating in the 1-1.6 μm near-infrared (NIR) wavelength regions. Silicon (Si) photodetectors do not meet these requirements since they have poor quantum efficiency for wavelengths greater than 1.1 μm and have low bandwidth, such as <500 MHz.

Currently, the dominant method to generate ultrafast laser pulses passively is the use of semiconductor saturable absorber minors (SESAMs), which is a mirror structure with an incorporated saturable absorber made with semiconductor technology. SESAMS are used for the generation of ultrashort pulses by passive mode locking of various types of lasers. Typically, a SESAM contains a semiconductor Bragg mirror and (near the surface) a single quantum well absorber layer. The materials of the Bragg mirror have a larger bandgap energy, so that essentially no absorption occurs in that region. Such SESAMs are sometimes also called saturable Bragg reflectors (SBRs). For obtaining a large modulation depth, as required—e.g., for passive Q-switching using Q-switched lasers—a thicker absorber layer can be used. Also, a suitable passivation layer on the top surface can increase the device lifetime. This type of passive mode locker produces exceptional results but is difficult to fabricate, expensive and limited to bandwidth.

Further, other potential remote sensing instruments with requirements to perform spectroscopic measurements, such as those using methane, need specific wavelengths most likely in the mid-infrared (IR) to long-wave IR (LWIR) bands, to match the absorption spectra of the species being studied, which are difficult to provide. Current spectroscopic techniques which offer broadband, high-resolution capability, require cumbersome optics with moving parts and/or sophisticated cryogenic cooling to obtain the necessary resolving power and sensitivity, and thus, are not suitable for air or space vehicle applications whose platforms require strict size and weight requirements. Further, commercial charge-coupled device (CCD) spectrometers are not available in the terahertz spectral range, and which can operate at room temperature.

Accordingly, an ultrafast photodetector and mode lock device for a laser transmitter which can bridge the gaps for high speed, highly sensitive detection from NIR to LWIR, in a remote sensing device, which is easy to produce, is needed. In addition, a tunable terahertz (THz) or sub-millimeter detector that can operate at room temperature would be advantageous.

SUMMARY OF THE INVENTION

The present invention relates to a method of manufacturing large area graphene which can be used in graphene-based photonics devices, for various applications. In one embodiment, the present invention is directed to a laser ranging instrument using graphene as a saturable absorber, to generate mode locked laser pulses. In addition, in one embodiment, the present invention is directed to a tunable metamaterial-based graphene terahertz (THz) spectrometer that can operate at room temperature.

In one embodiment, a novel method of fabrication of large area monolayer and multi-layer graphene samples of optical quality for a mode locking process, are achieved. The graphene-based saturable absorber of the present invention is easy to produce, has the advantages of a much wider bandwidth, lower saturation intensity, tunable modulation depth, ultrafast recovery time, and much higher optical damage threshold, thus, producing higher energies (10's nJ) and femtosecond pulses with a repetition rate on order of 100's MHz.

In one embodiment, the present invention takes advantage of the unique optical and electrical properties of graphene, as well as enhances the responsivity with plasmonic effects of graphene-grating metamaterials, to enable spectral imaging in the THz range important for applications in astrophysics, gas analysis for planetary bodies, thermal imaging for homeland security, and remote sensing.

In one embodiment, a method of preparing large area graphene, includes: growing a first graphene layer on one side of a metal substrate, and a second graphene layer on another side of the metal substrate; coating the first graphene layer with a plurality of resist layers; removing the second graphene layer and the metal substrate to reveal the first graphene layer; disposing the first graphene layer on an optical substrate; and removing the plurality of resist layers from the first graphene layer to reveal a final graphene layer.

In one embodiment, the first graphene layer and the second graphene layer are prepared using a low pressure chemical vapor deposition (LPCVD) technique.

In one embodiment, the plurality of resist layers include a relatively low molecular weight polymethylmethacrylate, and a relatively high molecular weight polymethylmethacrylate.

In one embodiment, the second graphene layer and the metal substrate are removed by etching.

In one embodiment, ionic contaminants are removed after the metal substrate is etched away.

In one embodiment, the metal substrate is a copper substrate.

In one embodiment, the optical substrate is a lead free optical glass with a linear optical transmission in a visible range down to 350 nm.

In one embodiment, the method includes degasing to remove water molecules from between the first graphene layer and the optical substrate.

In one embodiment, the plurality of resist layers and any contaminants are removed by thermal or chemical processing.

In one embodiment, the method includes providing a third graphene layer with a plurality of resist layers thereon, and disposing the third graphene layer on the final graphene layer which is disposed on the optical substrate.

In one embodiment, the method includes removing the plurality of resist layers from the third graphene layer.

In one embodiment, the plurality of resist layers on the third graphene layer are removed by high temperature anneal.

In one embodiment, the method further includes repeatedly adding additional graphene layers on the third graphene layer to form multiple graphene layers.

In one embodiment, the final graphene layer is used in a laser or mode locking application, or disposed on a tip of an optical fiber.

In one embodiment, the dimensions of the multiple graphene layers are controlled by patterning graphene films through photolithography or electron beam lithography methods.

In one embodiment, the final graphene layer is used in bolometric graphene detectors, or as a saturable absorber in ultra-high bandwidth detectors for producing ultrafast laser pulses.

In one embodiment, the final graphene layer is used in a detector which is used in a continuously tunable photodetection bandwidth from mid-infrared to at least long wave infrared radiation.

In one embodiment, the saturable absorber is single layer graphene or multiple layer graphene, and a saturable absorber performance of the multiple layer graphene detector is relatively less than that of a saturable absorber performance of the single layer graphene detector.

In one embodiment, the laser application is used in a laser ranging and altimeter system, including a laser imaging detection and ranging (LIDAR) sensor.

In one embodiment, the dimensions of a graphene device are controlled to form microscale graphene ribbons or strips that form a tunable plasmonic structure and can support plasma oscillations which resonate to enhance light absorption of graphene at plasmonic frequencies.

In one embodiment, the graphene device allows tuning of the plasmon frequency over a range of 1 to 10 terahertzfrequency in said microscale graphene ribbons or strips, at room temperature.

In one embodiment, the tunable plasmonic structure is formed by disposing a metal layer on the microscale graphene ribbons or strips to form a grating coupler, and further includes coupling light into the graphene device using the grating coupler.

In one embodiment, the method further includes applying an external bias voltage between the grating coupler and the microscale graphene ribbons or strips, to electrostatically gate the graphene device.

In one embodiment, an optical absorption band of the final graphene layer is tuned to create a passband filter by controlling a size of the graphene device or by controlling a chemical potential of the graphene device.

In one embodiment, bandgaps of bilayer graphene are used to yield a continuously tunable photodetection bandwidth from mid-infrared (MIR) to at least long wave infrared (LWIR), and programmable band gaps of graphene microscale ribbons or strips are used to fabricate detectors for wavelengths above 6 $\mu$m.

In one embodiment, Kerr nonlinearity effects of graphene under illumination are used to make nonlinear functional devices including at least one of optical switches, wavelength converters, or signal regenerators.

In one embodiment, a saturable absorber includes: at least one large area graphene layer disposed on an optical substrate; wherein the large area graphene layer is obtained in an LPCVD technique, by growing a first graphene layer on one side of a metal substrate, and a second graphene layer on another side of the metal substrate, coating the first graphene layer with a plurality of resist layers, removing the second graphene layer and the metal substrate to reveal the first graphene layer, disposing the first graphene layer on an optical substrate; and removing the plurality of resist layers from the first graphene layer to reveal a final graphene layer.

In one embodiment, the at least one large area graphene layer is a multiple graphene layer structure, achieved by repeatedly adding additional graphene layers on the third graphene layer to form multiple graphene layers.

In one embodiment, the final graphene layer is used in a laser or mode locking application, or disposed on a tip of an optical fiber.

Thus has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

DESCRIPTION OF THE INVENTION

The present invention relates to a method of manufacturing large area graphene, for use in graphene-based photonics devices, and which are used in a variety of applications. The present invention includes the fabrication of large area monolayer and multi-layer graphene samples of optical quality for a mode locking process. The present invention includes production of an ultrafast laser ranging instrument and an ultrawide bandwidth detector based on graphene as a saturable absorber, to demonstrate mode locking locked laser pulses in a laser application.

In addition, the present invention takes advantage of the unique optical and electrical properties of graphene, as well as enhances the responsivity with plasmonic effects of graphene-grating metamaterials, to enable spectral imaging in the THz range important for applications in astrophysics, gas analysis for planetary bodies, thermal imaging for homeland security, and remote sensing.

Figure 1A:
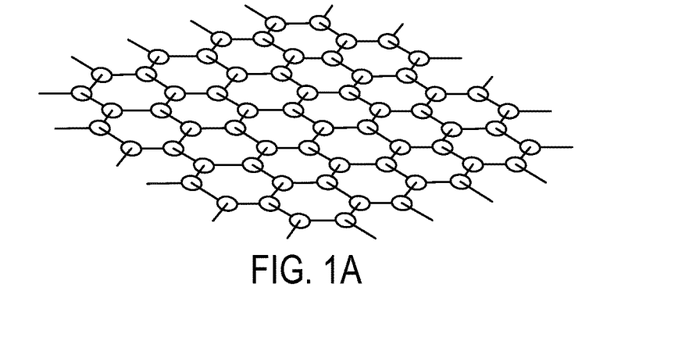
FIG. 1A shows the 2-dimensional lattice structure of graphene.

Graphene is a flat single layer carbon atoms packed in a honeycomb lattice (see FIG. 1A), and is the building block for many other carbon-based materials, including carbon nanotubes, fullerenes, and graphite. Graphene is a crystalline allotrope of carbon in the form of a two dimensional, transparent sheet of graphite, one atom in thickness, but which has great strength due to its very low weight, and efficiency in conducting heat and electricity.

Figure 1B:
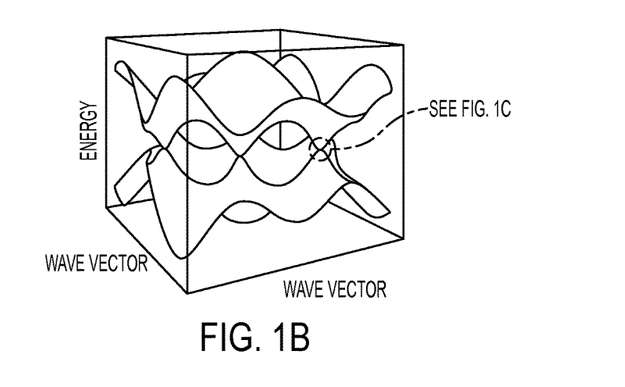
FIGS. 1B-1C show the unusual bank structure of graphene.
Figure 1C:
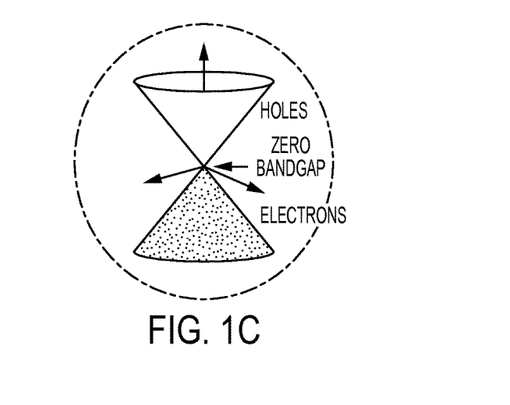

Graphene differs from typical semiconductors in that the valence and conduction bands are smooth cones and meet at a point called the Dirac point. One of the more interesting properties of graphene is that there is no energy bandgap and as such it can absorb photons at all wavelengths (see FIG. 1B). Since graphene is a zero-gap semiconductor, its electronic properties separate it from other condensed matter systems. Such unique absorption could become saturated when the input optical intensity is above a threshold value, called the "saturation fluence". This nonlinear optical behavior is called "saturable absorption", and thus, graphene can be saturated readily under strong excitation over the visible to the near-infrared (NIR) region, due to the universal optical absorption and zero band gap (see FIG. 1C). Thus, graphene's unique band structure and exceptional electronic properties produce high speed photodetectors with an ultrawide operational wavelength range at least from 300 nm to 6 µm. Saturable absorption in graphene could occur at the microwave and terahertz band, owing to its wideband absorption property. The microwave saturable absorption in graphene demonstrates the possibility of graphene microwave and terahertz photonics devices, such as a microwave saturable absorber, modulator, polarizer, and microwave signal processing and broad-band wireless access networks.

Based upon the above attributes, a graphene-based saturable absorber is an ideal passive mode-locker for many types of lasers. This unique property of full band mode locking by a graphene-based saturable absorber, has relevance for the passive mode locking of fiber lasers, to generate ultrafast pulses in the picosecond to femtosecond regimes, as well as for use as a photosensitive medium for photodetection. Further, due to this full band mode locking property, graphene has application in ultrafast photonics, and the optical response of graphene/graphene oxide layers can be tuned electrically.

A single atomic layer graphene has an external photo responsivity of 6.1 mA·W$^{-1}$ at 1.55 µm wavelength. In order to improve the overall absorption of incident light and to increase the photo-responsivity, the present invention includes increasing the thickness of graphene by stacking multiple layers, as well as increasing the interaction length between the incident photons and the graphene. The present invention has a novel detector architecture that balances the interaction lengths and thus, increases the absorption and the overall bandwidth of the detector.

Current methods to produce graphene include mechanical cleavage (i.e., taking layers from multi-layered graphite using adhesive tape), or by depositing one layer of carbon onto another material. Graphene platelets are also created by chemically cutting open carbon nanotubes, using potassium permanganate and sulfuric acid, for example, or by solvent or sonic exfoliation (separation) of graphite, as well as by plasma deposition, the reduction of graphene oxides (RGO), or other technologies.

In current device fabrication processes, graphene is grown using methods including exfoliation or chemical vapor deposition (CVD) process.

In the exfoliation-based approach, graphene films are produced in a process including exfoliating graphene flakes (10-20 microns) from Highly Oriented Pyrolitic Graphite (HOPG) crystals. Since many small flakes of exfoliated graphene make it challenging for laser applications, the small flakes of exfoliated graphene, which show superior electrical properties, are mixed with polyvinyl alcohol (PVA) or other polymers in an ultrasonic mixer, to make a graphene composite.

In one embodiment, the composite uniform suspension of graphene flakes is applied on a silicon dioxide wafer through spincoating to make a thin and uniform film, evaporating the solvent, and removing the film from the silicon dioxide substrate upon desiccation, to obtain a free-standing graphene composite that is patterned to make the laser. This technique generates ultrafast laser pulses.

In another method, a low pressure chemical vapor deposition (LPCVD) system is used to make a large area of LPCVD graphene as the solution for ultrawide bandwidth detectors. In this method, a graphene film is grown on a substrate, such as a metal (i.e., copper) substrate, through an LPCVD process, where $H_2$, $CH_4$, and Ar gases are utilized to grow graphene at 1000° C. Although LPCVD graphene can be produced in large pieces (a few inches), it shows relatively weaker electrical properties compared to the exfoliating graphene approach. However, the CVD approach provides control of the graphene size and thickness. Single layer and multi-layer graphene can be produced by selecting the right substrate and process conditions.

Figure 8A:
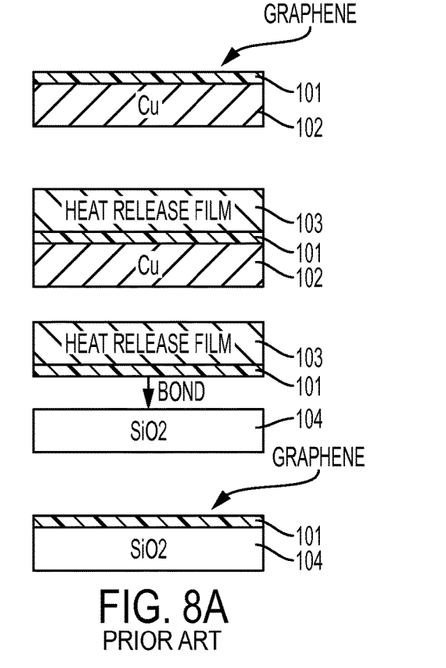
FIGS. 8A and 8B are schematic diagrams showing the steps in the current transfer methods for graphene.

Specifically, in one current transfer method to produce large area graphene, graphene 101 (see FIG. 8A) is grown on a metal substrate, such as a copper substrate 102, then a heat release film 103 is applied to the graphene 101. Thereafter, the copper substrate 102 is etched away, and the graphene 101 is placed on a silicon oxide layer 104. Thereafter, the heat release film 103 is removed, leaving the graphene 101 disposed on the silicon oxide substrate 104 as a composite.

Figure 8B:
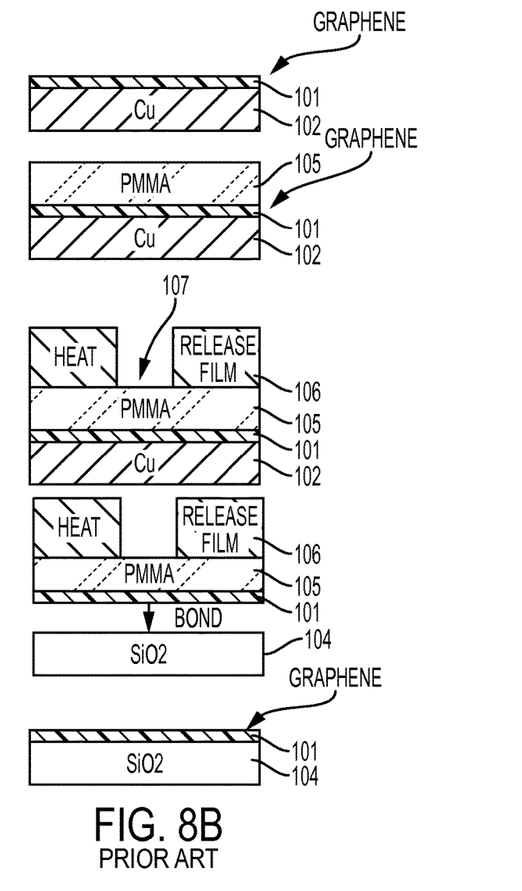

In another current transfer method, graphene 101 (see FIG. 8B) is grown on a metal substrate, such as a copper substrate 102, and then a layer 105 of polymethylmethacrylate (PMMA) is applied on the graphene 101 layer. The copper substrate 102 is then etched away, exposing the graphene layer 101, and graphene is placed on a silicon dioxide substrate 104. The PMAA 105 layer is then removed by thermal or chemical processing, leaving bare graphene 101 on the silicon dioxide substrate 104.

In the manufacturing process of the present invention, a low pressure chemical vapor deposition (LPCVD) technique is used to grow large area graphene. A transition metal substrate such as copper is heated in a CVD reactor to a temperature of about 850° C. to about 1000° C. under an ambient pressure of hydrogen ($H_2$), or argon (Ar), or a mixture thereof, introducing reactions gas mixtures to the CVD reactor, and growing graphene on the copper substrate. In some embodiments, the reaction gas mixtures include flowing methane ($CH_4$) of about 1 to about 20 standard cubic centimeters per minute (sccm), flowing $H_2$ of about 5 to about 50 sccm, and flowing Ar of about 200 to about 1000 sccm.

The novel fabrication method of the present invention includes transferring graphene, in multiple layers, to suitable optical substrates, as well as the tips of optical fibers. The novel process of the present invention produces clean (i.e., no contaminants such as tape residue, which is produced in previous methods), large area graphene, suitable for use in laser or mode locking applications.

Figure 2A:
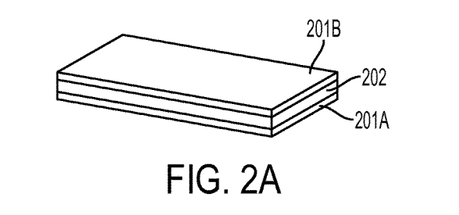
FIGS. 2A-2I are schematic diagrams showing the steps in a novel transfer method for large area graphene, according to one embodiment consistent with the present invention.
Figure 2B:
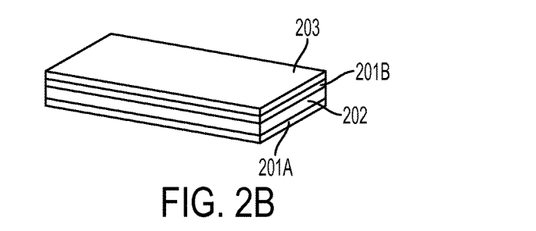

Specifically, in one embodiment in the novel large area graphene manufacturing process of the present invention, as illustrated in FIG. 2A, a graphene layer is grown on both the topside and the bottom side of the metal substrate, such as a copper substrate 202 through the CVD process. As shown in FIG. 2B, the top layer of graphene, 201B, on the copper substrate 202 is coated with a low molecular weight PMMA 203 as a thin resist, to minimize interaction between the PMAA 203 and the graphene layers 201B.

Figure 2C:
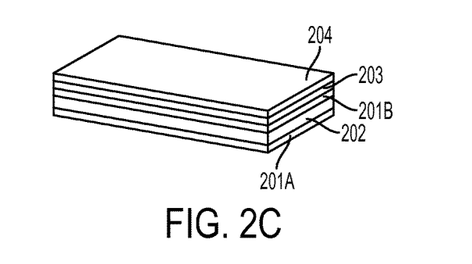
Figure 2D:
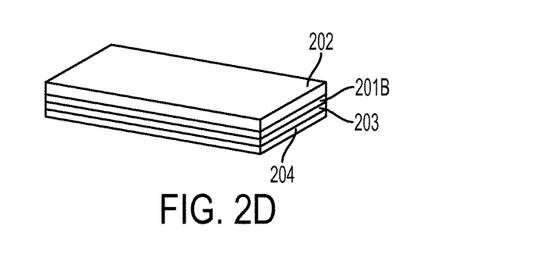

As shown in FIG. 2C, a thicker layer of PMMA 204 is coated as a support layer on the low molecular weight PMMA 203. In the step shown in FIG. 2D, the bottom side of the graphene layer 201A is then etched away to reveal the copper substrate 202.

Figure 2E:
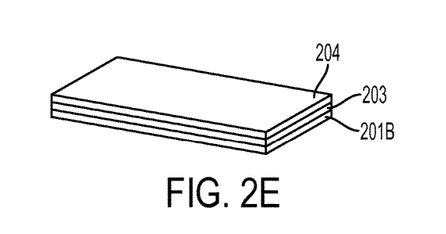
Figure 2F:
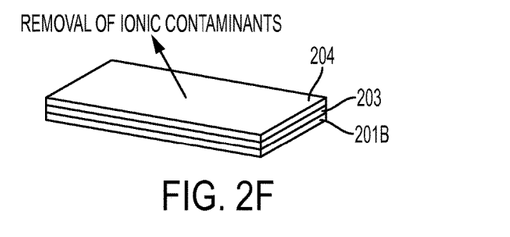
Figure 2G:
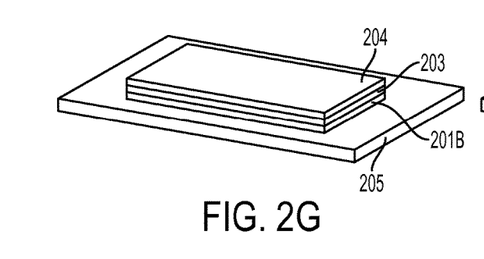

As illustrated in FIG. 2E, the copper substrate 202 is then etched away, leaving the PMMA layers 203, 204 on a single graphene layer 201B. As shown in FIG. 2F, ionic contaminants are removed with a dilute hydrochloric acid (1-20% in water) followed by rinse in deionized water, and in the step shown in FIG. 2G, the graphene layer 201B is disposed on an activated N-BK7 substrate 205.

N-BK7 is an arsenic- and lead-free optical glass used for high quality optical components, and is activated by dry or wet processing techniques. It has good scratch resistance, low inclusions, almost bubble-free, and high linear optical transmission in the visible range down to 350 nm.

Figure 2H:
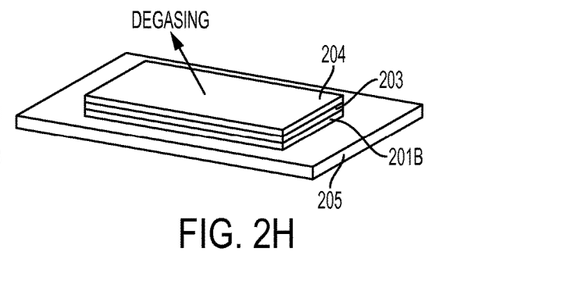

As shown in FIG. 2H, degasing is performed to remove water molecules from between the graphene layer 201B and the BK7 substrate 205. Finally, as shown in FIG. 2I, the graphene/BK7 structure 201B/205 is annealed to remove the PMMA layers 203, 204 and any other contaminants, resulting in a graphene layer 201B on the BK7 optical glass substrate 205.

The transmission of the monolayer graphene samples produced by this novel method, were measured using a spectrometer, and the absorption of the single layer graphene was found to have excellent results of approximately 2% over a range of nearly all wavelengths (i.e., 200 nm to 1060 nm)—which is about 60 times better than gallium arsenide (GaAs) with the same thickness.

In addition, a novel process was also developed for depositing multiple graphene layers on the same substrate. This second process provides control over the exact number of graphene layers used and minimizes the folding or voids that could develop when depositing multiple graphene layers on top of one another.

Figure 2I:
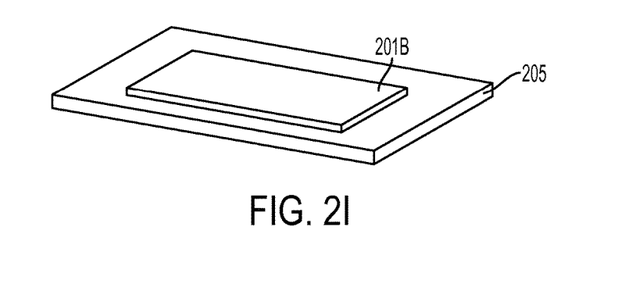
Figure 3A:
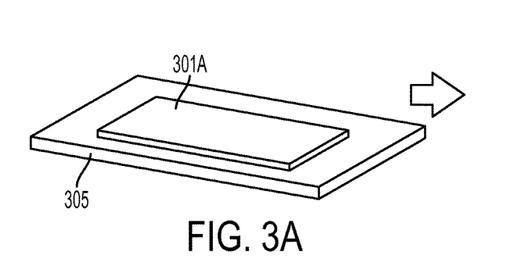
FIGS. 3A-3D are schematic diagrams showing the steps in a novel multilayer transfer method for large area graphene, according to one embodiment consistent with the present invention.
Figure 3B:
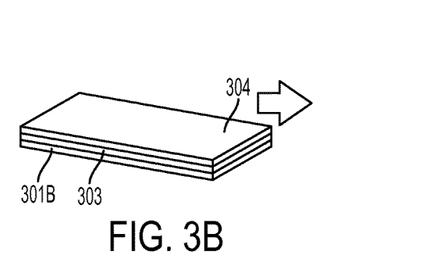
Figure 3C:
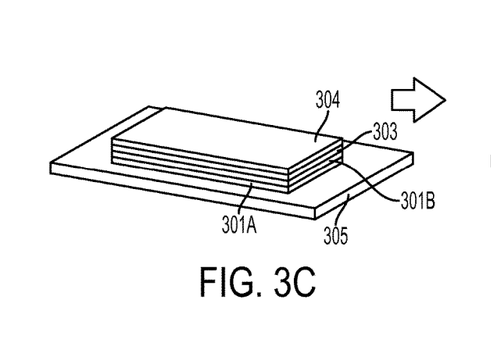
Figure 3D:
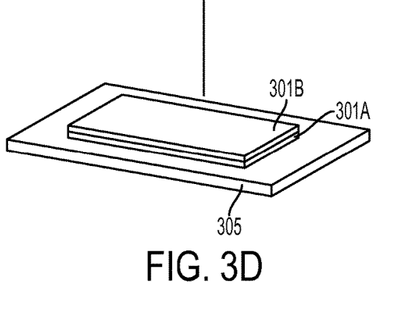

Specifically, in one embodiment, as illustrated in FIG. 3A, once the graphene layer 301A is on the BK7 substrate 305 (as shown in FIG. 2I), a second layer of graphene 301B supported by PMMA layers 303, 304 (as shown in FIG. 3B, and as produced in FIG. 2E) is prepared. As shown in FIG. 3C, this additional layer 301B of graphene is aligned with the first graphene layer 301B and disposed thereon, to form a multiple layer of graphene, then the PMMA layers 303, 304 are removed with a high temperature anneal (see FIG. 3D).

As shown in step FIG. 3E, to form additional layers of graphene, this sequence can be repeated multiple times. This novel process provides precise control over the number of graphene layers, as well as minimizes the folding or voids that could develop when depositing graphene layers on top of one another. In addition, the novel process of the present invention eliminates residues and contaminants usually present on the top of the graphene samples. This novel clean transfer method for large area graphene is used on an optical substrate or on the tip of an optical fiber, to meet specific optical requirements.

In one embodiment, in preparation of the graphene-based laser, the graphene and graphene composite films produced are tailored and transferred to an optical substrate as noted above. An electron beam (E-beam) writing tool may be utilized to define metal contacts on the graphene films. The contacts allow electrical characterization of the devices. Produced graphene and graphene composites may be characterized using a Scanning Electron Microscope (SEM), Scanning Tunneling Microscope (STM), Atomic Force Microscope (AFM), and Raman Spectroscope.

In one embodiment, using the graphene layer(s) transferred on the optical substrate (i.e., BK7 substrate) as the saturable absorber at the 1500 nm band, a passive solid-state mode-locked laser can be built. The laser cavity optical parameters contribute to the optimal design of a mode locked laser.

In one embodiment, as noted above, a graphene saturable absorber is produced by placing a single layer of graphene on the tip of a fiber optic cable. The fiber optic cable offers ease of measurement and integration to other optical elements. Normally, an optical fiber is immersed in solution with dispersed graphene flakes or floating graphene pieces, and a light source was used to shine through the fiber. The graphene piece or flake is collected at the fiber tip due to multiple causes, including convection induced by the light and thermophoresis.

Figure 4:
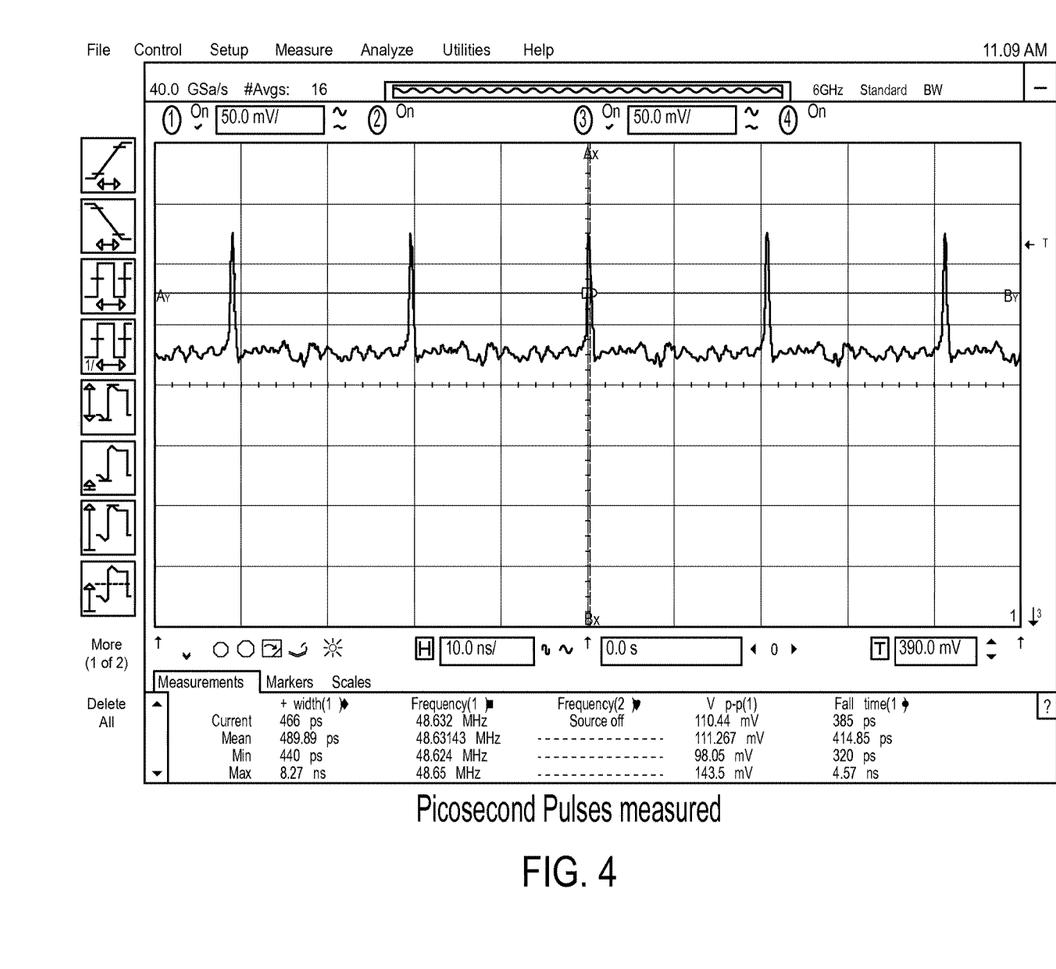
FIG. 4 is a graph showing the results of the mode locked pulses and optical spectrum of a mode-locked graphene-based photonic device, according to one embodiment consistent with the present invention.

In the present invention, mode locking is achieved with the single layer graphene on the polarization maintaining (PM) fiber tip. The PM fiber tip was placed inside of a fiber ring cavity. Results of the mode locked pulses and optical spectrum are shown in FIG. 4. The mode locked pulses were more stable with additional graphene layers, which produced more loss in the cavity, increasing the depth of modulation which improved stability.

The layer-dependency of graphene on pulse energy, losses in cavity, pulse width, etc., were analyzed, whereas a known number of graphene layers were deposited on dielectric coated substrates (i.e., fused silica substrate with $SiO_2$ coating) that could be used for intra-cavity mode-locking. The saturable absorber may be single layer graphene, multilayer graphene, or graphene-polymer composites. The graphene samples of the present invention were tested and characterized with a laser transmitter and high energy (10 s nJ), and femtosecond pulses with repetition rate on order of 100's MHz have been demonstrated using graphene as saturable absorber.

The saturable absorber performance is strongly dependent on the number of layers of graphene. Monolayer graphene has one of the largest modulation depths of all known saturable absorbers, a value of >60%, whereas the modulation depth of multilayer graphene is greatly reduced due to nonsaturable absorption and scattering loss. Defects such as wrinkles will also increase the nonsaturable absorption and lower the performance of the mode-locker in the laser. Femtosecond ultrafast laser pulses can be generated using monolayer graphene as a saturable absorber. Due to the ultrafast relaxation time, larger modulation depth and lower scattering loss of monolayer graphene, it has advantages over multilayer graphene in terms of pulse shaping ability, pulse stability and output energy. Thus, the graphene produced by the present invention is useful as an absorber as it is wavelength independent and can be used in many different laser systems.

Figure 5:
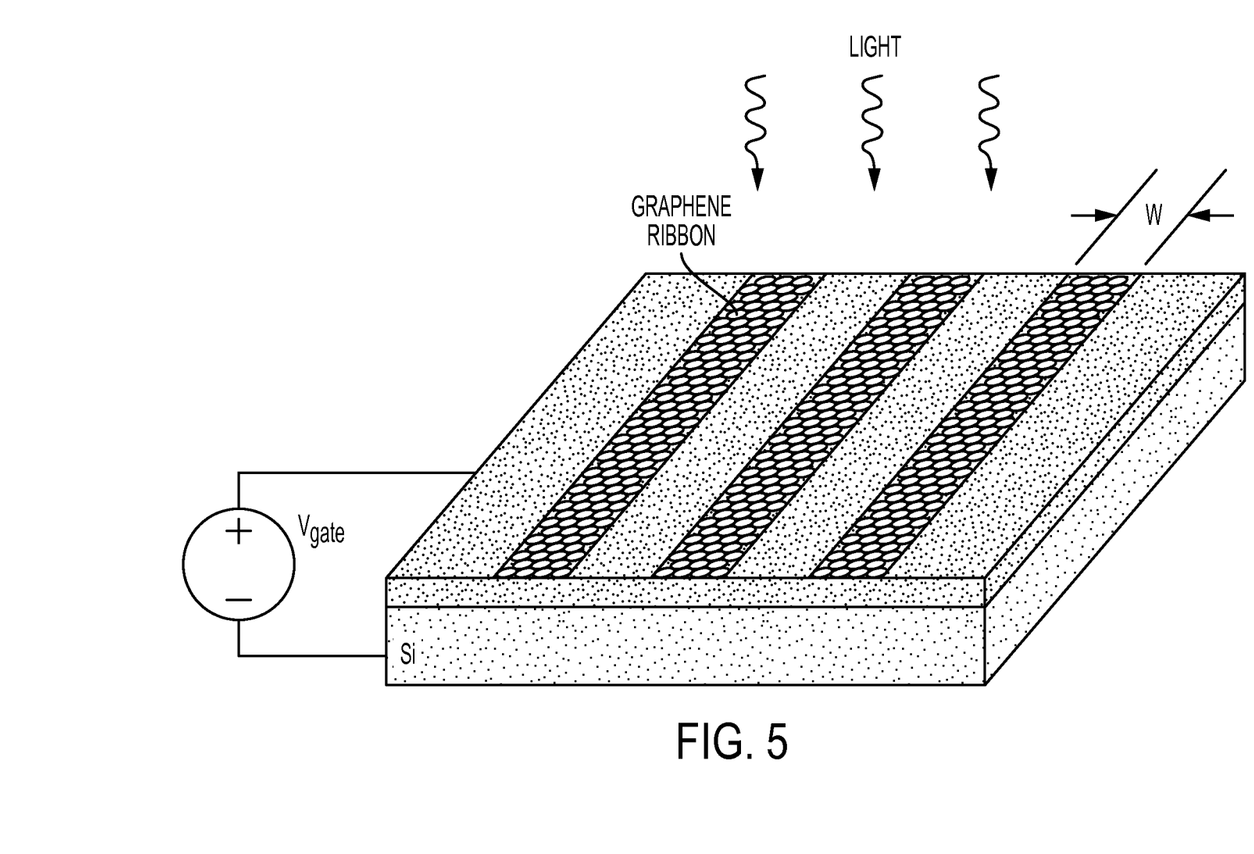
FIG. 5 is a schematic diagram showing how the graphene-based photonics device dimensions can be controlled by patterning graphene films through photolithography and electron beam lithography methods to form micro scale graphene ribbons that can support plasma oscillations, according to one embodiment consistent with the present invention.

In one embodiment, the graphene device dimensions can be controlled by patterning graphene films through photolithography and electron beam lithography methods to form microscale graphene ribbons or strips that form a tunable plasmonic structure and that can support plasma oscillations (see FIG. 5). Plasmons are collective oscillations of carriers in a material, with the carrier density and the bank structure dictating the characteristic plasmon frequency. The carrier density, the size and the shape of the graphene elements are controlled to achieve intended plasmon resonant frequencies. Tunable plasmonic metamaterial can be made by varying the width of graphene microstrips and electrostatic doping in them. In particular, these plasma oscillations can resonate to enhance the light absorption of graphene at plasmonic frequencies by increasing the effective surface conductance. Purely two-dimensional structures of graphene, and the electronic properties that result from it, allow tuning of the plasmon frequency over a broad terahertz frequency range in graphene microstrips.

Figure 6A:
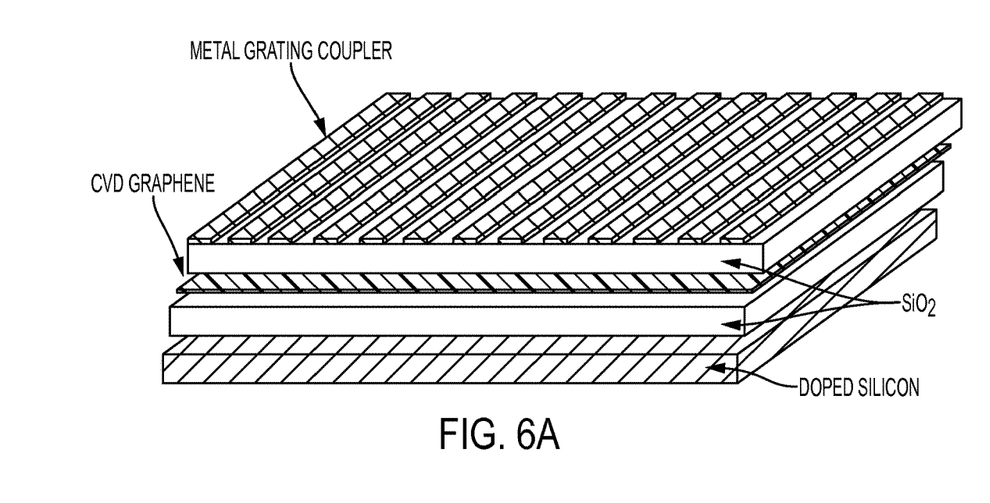
FIG. 6A is a schematic diagram showing how a tunable plasmonic structure is formed by coupling light into graphene resistors using grating couplers, for a tunable THz detector, according to one embodiment consistent with the present invention.

In one embodiment, a tunable plasmonic structure is formed by coupling light into graphene transistors using grating couplers. Specifically, in one embodiment, as illustrated in FIG. 6A, a metal layer can be put on graphene and patterned into strips to form a metal grating coupler. Graphene's unique band structure (see FIGS. 1A and 1B) enable direct transitions to take place, along with strong coupling to light at all wavelengths. In addition, plasmonic behavior in metamaterial-based graphene devices significantly enhances absorption at selected frequency. When the grating periodicity is shorter than the wavelength of incident light, the grating bars become polarized and the resulting fringing electric field can couple to plasmons in graphene. The metal layer is patterned using photolithography or electron beam lithography.

Figure 6B:
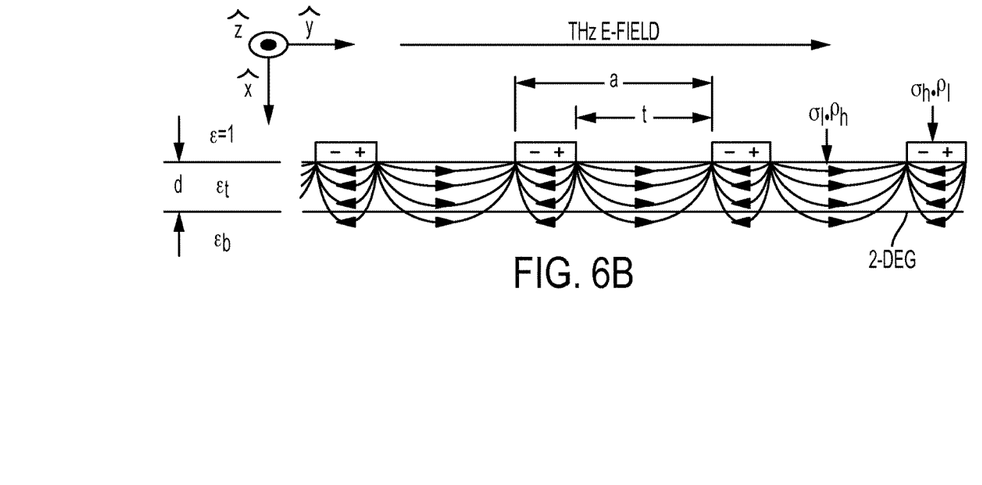
FIG. 6B is a graph showing how the THz induced fringing from the grating of FIG. 7(a) couples to plasmons, according to one embodiment consistent with the present invention.
Figure 6C:
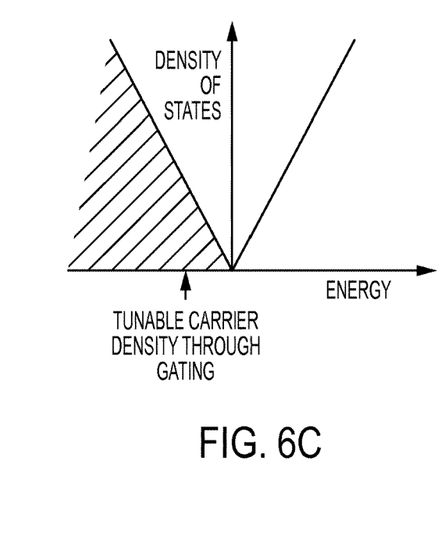
FIG. 6C is a graph showing the tunable electronic density of states of the tunable THz detector of FIG. 6A with an external bias applied, according to one embodiment consistent with the present invention.

Furthermore, an external bias voltage can be applied between the coupler and graphene to electrostatically gate graphene. By varying the bias voltage or doping in silicon, the carrier density can be tuned, as shown in FIGS. 6B-6C, which, in turn, dictates the plasmon frequency in graphene. Sharp and strong optical absorption features in the THz range were observed even at room temperature due to plasmonic enhancement. In one embodiment, plasmon resonance was found to be tunable from 1 to 10 THz (or wavelengths of 30-300 μm), a desired range for astrophysics and planetary science. FIG. 6A is just one example of a plasmonic resonator; other examples include, but are not limited to, concentric graphene discs and concentric rectangles.

In another embodiment, when graphene is doped either chemically or by applying a gate voltage, it produces a two-dimensional sea of electrons that can absorb radiation, producing a population of energized hot electrons. The unique nature of graphene offers a much weaker electron-phonon coupling than in competing materials or detectors. As a result, it is possible to directly sense the hot electrons in graphene before they have a chance to dissipate to the lattice, allowing for fast thermal measurement.

In fact, the present invention includes a scalable graphene-based bolometer technology, which measures the power of incident electromagnetic radiation using the hot electron phenomenon. Multilayer turbostratic and (Bernal) AB-stacked graphene, which can be reliably synthesized from the CVD processes, were used to determine the impact of the layer thickness and stacking structure on the bolometric performance. Devices fabricated using single layer graphene were used as the benchmark for the performance of a defect-free graphene-based sensor and as the starting point for exploring how the bolometric response can be optimized.

Figure 7:
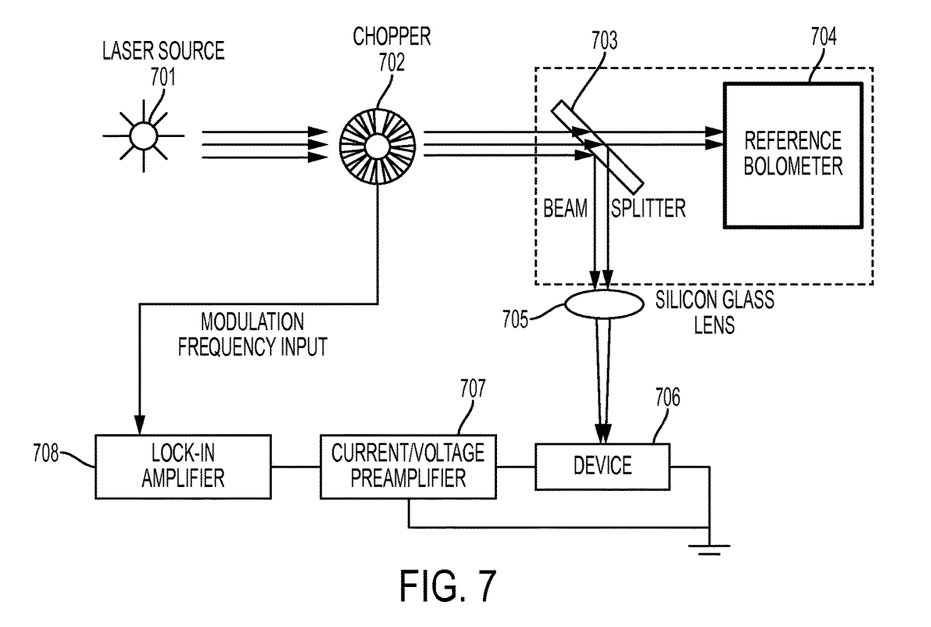
FIG. 7 is a schematic diagram showing a test setup for measuring the bolometric response of a metamaterial-based graphene-grating detector, according to one embodiment consistent with the present invention.

In one embodiment, a novel ultra-high bandwidth detector is derived from graphene-based photodetectors operating in several different novel detection modes, and is used in an apparatus to measure the bolometric response is shown in FIG. 7. A laser source 701 emits light beams which enter an optical chopper 702 which interrupts the beams. The beams are split by beam splitter 703, with some of the beams entering reference bolometer 704 and the other of the beams passing through silicon/glass lens 705, and entering the metamaterial graphene-grating device 706 of FIG. 7. With respect to the device 706, an ultra-high bandwidth bolometric detector can be developed using a single layer graphene, 3.45 angstrom thick, which can absorb 2.3% of incident photons as long as the photon energies do not exceed the inter-band transition energies of 4 eV. Similar absorption efficiency will require a 20 nm thick indium gallium arsenide (InGaAs) at 1.5 μm, showing the superiority of graphene-based bolometers.

The device 706 is connected to current/voltage preamplifier 707, and grounded. The chopper 702 is connected to a lock-in amplifier 708 which measures the modulation frequency input, and the lock-in amplifier 708 is connected to preamplifier 707.

The bolometric response of these devices 706 was determined by optical absorptivity and temperature dependent resistivity. The bolometric response to broad wavelengths was measured as a function of type of substrates used, incoming wavelengths, and applied gate voltage. For example, the ultimate performance limitations of the graphene detector were measured, and the responsivity was characterized, along with the noise equivalent power (NEP), the normalized detectivity and spectral resolution of the spectrometers.

As a result, it was determined that the performance of these detectors may be optimized by using more than one layer of graphene, thus, increasing the total radiation absorption and by tuning the temperature dependent resistivity using different substrates. Further, optimization may be achieved using bilayer graphene and doped graphene in graphene-based photodetectors.

In another novel property of the photonic device of the present invention, the optical absorption band of graphene can be tuned to create a passband filter by controlling the size of the graphene devices or by controlling the chemical potential of graphene. Second, bandgaps of bilayer graphene can be used to yield a continuously tunable photodetection bandwidth from mid-infrared (MIR) to LWIR radiation and beyond. Therefore, the performance of bilayer-graphene-based photodetectors can be tuned on demand. Finally, it was found that "programmable" band gaps of graphene nanoribbons can be utilized to fabricate detectors for wavelengths above 6 µm.

In another novel property of the photonic device of the present invention, high Kerr nonlinearity effects of graphene under intense illumination can be used to make various nonlinear functional devices, including but not limited to, optical switches, wavelength converters, and signal regenerators. The present invention of graphene photonic device is advantageous over other Kerr-nonlinearity mediums because of wavelength independence and non-resonant nature.

A laser ranging and altimeter system of the present invention, with an ultrashort pulse duration in picosecond-femtosecond regime, would be able to provide sub-millimeter range information for applications in proximity sensing, terrain relative navigation, landing, docking, etc. Similar short pulsed laser systems can be used in a frequency up-conversion scheme to generate entangled photon pairs for quantum communications and quantum key distribution applications. A frequency comb with femtosecond pulses can be used to generate precision clocks for laser time transfer and clock synchronization. The present invention can achieve LIDAR missions which require high bandwidth and low-noise photodetectors operating in the 1-1.6 µm wavelength regions.

In summary, the graphene-based saturable absorber photonic device of the present invention is used to generate high repetition rate mode locked lasers, with applications in a variety of fields, including, but not limited to, laser ranging and altimeter systems with high precision (in sub-millimeter accuracy); ultra-fast detectors for high speed optical communications and navigation; time distributions with laser time transfer technique using frequency comb, quantum communications, imaging LIDAR, remote sensing and in-situ optical sensors, optical signal processing, two-photon microscopy, Q-switches, wavelength converters, signal regenerators, tunable terahertz spectrometers, and laser surgery. The ultrafast laser and ultrawide bandwidth detector demonstrates a laser ranging instrument that provides unprecedented precision, and that is useful for space applications. Further, spectral imaging in the THz range makes the tunable THz detector useful for astrophysics, earth science, gas analysis for planetary bodies, thermal imaging for homeland security, as well as remote sensing.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A method of preparing large area graphene for use in a tunable terahertz bandwidth range spectroscope capable of operating from mid infrared to long wave infrared, where mid infrared is 300 nanometers and long wave infrared is 6 micrometers in wavelength, plus or minus 10 percent in wavelength, for use in a space based vehicle, comprising:

growing a first graphene layer on one side of a metal substrate without using metal pins, and a second graphene layer on another side of said metal substrate also without using metal pins, said first and second graphene layers with external photo responsivity of 6.1 mA/W at 1.55 micrometer wavelength;

coating said first graphene layer with a plurality of resist layers;

removing said second graphene layer and said metal substrate to reveal said first graphene layer;

disposing said first graphene layer on an optical substrate;

removing said plurality of resist layers from said first graphene layer to reveal a final graphene layer, and installing said tunable terahertz bandwidth range spectroscope integral to said space based vehicle;

using said final graphene layer in a saturable absorber at the 1500 nm band by placing a single layer of graphene on the tip of a fiber optic cable in ultra-high bandwidth detectors for producing ultrafast laser pulses, each of said ultra-high bandwidth detectors integral to said spectroscope; wherein said saturable absorber is one of a single layer graphene and multiple layer graphene, and a saturable absorber performance of said multiple layer graphene detector is relatively less than that of a saturable absorber performance of said single layer graphene detector;

patterning graphene films through photolithography to form microscale graphene ribbons of tunable plasmonic structures that support plasma oscillations by varying the width of graphene microstrips and electrostatic doping in said graphene microstrips; and further patterning a metal layer on graphene into strips to form a metal grating coupler to enable coupling to light at all wavelengths.

2. The method of claim 1, wherein said first graphene layer and said second graphene layer are prepared using a low pressure chemical vapor deposition (LPCVD) technique.

3. The method of claim 2, wherein said plurality of resist layers include a relatively low molecular weight polymethylmethacrylate, and a relatively high molecular weight polymethylmethacrylate.

4. The method of claim 3, wherein said second graphene layer and said metal substrate are removed by etching.

5. The method of claim 4, wherein ionic contaminants are removed after said metal substrate is etched away.

6. The method of claim 5, wherein said metal substrate is a copper substrate.

7. The method of claim 6, wherein said optical substrate is a lead free optical glass with a linear optical transmission in a visible range down to 350 nm.

8. The method of claim 7, further comprising:
degasing to remove water molecules from between said first graphene layer and said optical substrate.

9. The method of claim 8, wherein said plurality of resist layers and any contaminants are removed by thermal or chemical processing.

10. The method of claim 1, further comprising:
providing a third graphene layer with a plurality of resist layers thereon, and disposing said third graphene layer on said final graphene layer which is disposed on said optical substrate.

11. The method of claim 10, further comprising:
removing said plurality of resist layers from said third graphene layer.

12. The method of claim 11, wherein said plurality of resist layers on said third graphene layer are removed by high temperature anneal.

13. The method of claim 10, further comprising:
repeatedly adding additional graphene layers on said third graphene layer to form multiple graphene layers.

14. The method of claim 1, wherein said final graphene layer is used in a laser or mode locking application, or disposed on a tip of an optical fiber.

15. The method of claim 13, wherein dimensions of said multiple graphene layers are controlled by patterning graphene films through photolithography or electron beam lithography methods.

16. The method of claim 14, wherein said laser application is used in a laser ranging and altimeter system, including a laser imaging detection and ranging (LIDAR) sensor.

* * * * *